(12) United States Patent
Chang et al.

(10) Patent No.: US 7,432,042 B2
(45) Date of Patent: Oct. 7, 2008

(54) IMMERSION LITHOGRAPHY PROCESS AND MASK LAYER STRUCTURE APPLIED IN THE SAME

(75) Inventors: Vencent Chang, Taipei (TW); George Liu, Taoyuan Hsien (TW); Norman Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 352 days.

(21) Appl. No.: 10/728,135

(22) Filed: Dec. 3, 2003

(65) Prior Publication Data

US 2005/0123863 A1    Jun. 9, 2005

(51) Int. Cl.
 *G03F 7/00* (2006.01)
(52) U.S. Cl. ............... 430/322; 430/320; 430/330
(58) Field of Classification Search .......... None
 See application file for complete search history.

(56) References Cited

U.S. PATENT DOCUMENTS 5,282,066 A * 1/1994 Yu et al. ............. 359/3
6,939,664 B2 * 9/2005 Huang et al. ........... 430/270.1

FOREIGN PATENT DOCUMENTS

EP    1152036 A1 * 11/2001

* cited by examiner

*Primary Examiner*—John A. McPherson
*Assistant Examiner*—Daborah Chacko Davis
(74) *Attorney, Agent, or Firm*—J.C. Patents

(57) ABSTRACT

An immersion lithography process is described as follows. A photoresist layer and a protective layer are sequentially formed on a material layer, and then an immersion exposure step is performed to define an exposed portion and an unexposed portion in the photoresist layer. A solubilization step is conducted to solubilize the protective layer on the exposed portion of the photoresist layer, and then a development step is conducted to remove the exposed portion of the photoresist layer and the protective layer thereon. Since the photoresist layer is covered with the protective layer, the chemicals in the photoresist layer do not diffuse into the immersion liquid to cause contamination. The protective layer can be patterned simultaneously in the development step, and no extra step is required to remove the protective layer. Therefore, the whole lithography process is not complicated.

7 Claims, 4 Drawing Sheets

IMMERSION LITHOGRAPHY PROCESS AND MASK LAYER STRUCTURE APPLIED IN THE SAME

BACKGROUND OF THE INVENTION

1. Field of the Invention

The present invention relates to a lithography process. More particularly, the present invention relates to an immersion lithography process and a mask layer structure applied in the same.

2. Description of the Related Art

Lithography is one of the most important techniques utilized in semiconductor manufacture, and is used in any process required to define patterns, such as a wafer layer patterning process or a doped-region defining process. A lithography process generally includes an exposure step and a development step, wherein the exposure step utilizes a light source to irradiate a photoresist layer directly or through a photomask to induce chemical reactions in exposed portions. The development step is conducted to remove the exposed portion and form photoresist patterns, thus completing the transfer of photomask patterns or virtual patterns.

Among various lithography techniques, the immersion lithography technique has been well developed to cope with the miniaturization of IC devices accompanying with the increase in degree of IC integration. An immersion lithography process is conducted in a liquid-phase environment, and has a higher resolution because the refractive index of a liquid is closer to that of the photoresist material as compared with air. Therefore, the dimensions of IC devices can be reduced with the immersion lithography technique.

However, since the photoresist layer directly contacts with the immersion liquid during the exposure step of an immersion lithography process, the immersion liquid is easily contaminated by the chemicals out-diffusing from the photoresist layer. The immersion liquid may also diffuse into the photoresist layer and alter the properties of the latter. Therefore, the critical dimension and the uniformity of the photoresist patterns are adversely affected.

SUMMARY OF THE INVENTION

In view of the foregoing, this invention provides an immersion lithography process capable of preventing contamination of the immersion liquid caused by out-diffusion of the chemicals in the photoresist layer.

This invention further provides a mask layer structure applied in the immersion lithography process of this invention. The mask layer structure is capable of preventing out-diffusion of the chemicals in the photoresist layer into the immersion liquid and diffusion of the immersion liquid into the photoresist layer.

An immersion lithography process provided in this invention includes the following steps. A photoresist layer is formed on a material layer, and then a protective layer is formed on the photoresist layer. An immersion exposure step is conducted to define an exposed portion and an unexposed portion in the photoresist layer. A solubilization treatment is then performed to solubilize the protective layer on the exposed portion of the photoresist layer. A development step is conducted to remove the exposed portion of the photoresist layer and the protective layer thereon to simultaneously pattern the photoresist layer and the protective layer.

Another immersion lithography process provided in this invention includes the following steps. A photoresist layer, an acid supplying layer and a protective layer are sequentially formed on a material layer. An immersion exposure step is then conducted to define an exposed portion and an unexposed portion in the photoresist layer, while acid is produced in the exposed portion of the acid supplying layer. A solubilization treatment is performed to make the acid produced in the exposed portion of the acid supplying layer diffuse into the protective layer thereon and the unexposed portion of the photoresist layer. A development step is then conducted to simultaneously pattern the protective layer, the acid supplying layer and the photoresist layer.

The mask layer structure applied in the immersion lithography process of this invention includes a photoresist layer disposed on a material layer and a protective layer disposed on the photoresist layer. In another embodiment, the mask layer structure further includes an acid supplying layer between the photoresist layer and the protective layer.

Since the photoresist layer is covered with a protective layer, the chemicals in the photoresist layer are prevented from diffusing into the immersion liquid and the immersion liquid is prevented from diffusing into the photoresist layer. That is, this invention is capable of solving the problem of mutual diffusion between the immersion liquid and the photoresist layer that is encountered in the prior art.

Moreover, the protective layer can be patterned simultaneously in the development step of the photoresist layer without any additional removal step. Therefore, the whole lithography process is not complicated.

Furthermore, when an additional acid supplying layer is disposed between the protective layer and the photoresist layer, the acid produced in the acid supplying layer in the exposure step will diffuse to the protective layer on the exposed portion and the unexposed portion of the photoresist layer in the subsequent solubilization step. Therefore, not only the protective layer can be patterned simultaneously in the development step, but also the dimension of the photoresist pattern can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The preferred embodiments of this invention will be described in reference of the drawings. It is to be understood that the preferred embodiments are provided to further explain the principles of this invention but not to restrict the scope of this invention.

First Embodiment

Figure 1A:
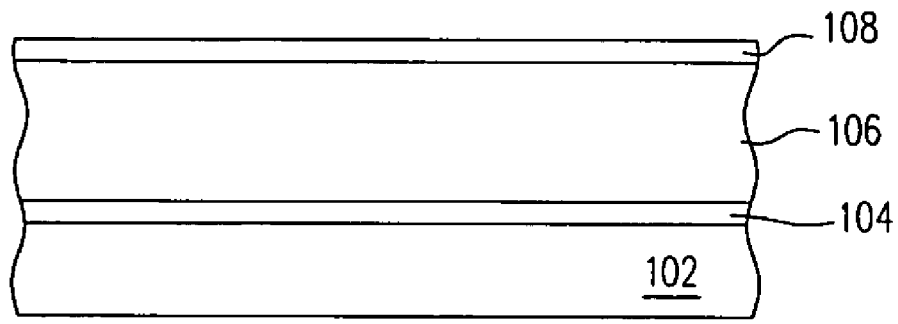
FIGS. 1A-1D illustrate the steps of an immersion lithography process according to a first embodiment of this invention in a cross-sectional view.

FIGS. 1A-1D illustrate the steps of an immersion lithography process according to the first embodiment of this invention in a cross-sectional view. Referring to FIG. 1A, a material layer 102 is provided first. The type of the material layer 102 is not particularly restricted, and the material layer 102 can be any type of layer that requires a patterned photoresist layer for further processing. For example, the material layer 102 can be a layer to be patterned, which may be a dielectric layer or an electrically conductive layer. The material layer 102 may alternatively be a layer to be implanted with ions, such as the surface layer of a silicon wafer, a dielectric layer or an electrically conductive layer.

Referring to FIG. 1A again, a photoresist layer 106 is formed on the material layer 102. The material of the photoresist layer 106 is, for example, an existing photosensitive resin composition, and the method for forming the same may include a spin-on step and a baking step. An anti-reflection coating (ARC) 104 can also be formed on the material layer 102 prior to the photoresist layer 106. The ARC 104 is constituted of an organic or an inorganic material, and is formed to prevent reflective light from the surface of the material layer 102 that would interfere with the incident light in the photoresist layer 106 to produce standing waves affecting the profile of the photoresist patterns.

Referring to FIG. 1A again, a protective layer 108 is formed on the photoresist layer 106. The method for forming the protective layer 108 can be a coating method or any other suitable method.

Figure 1B:
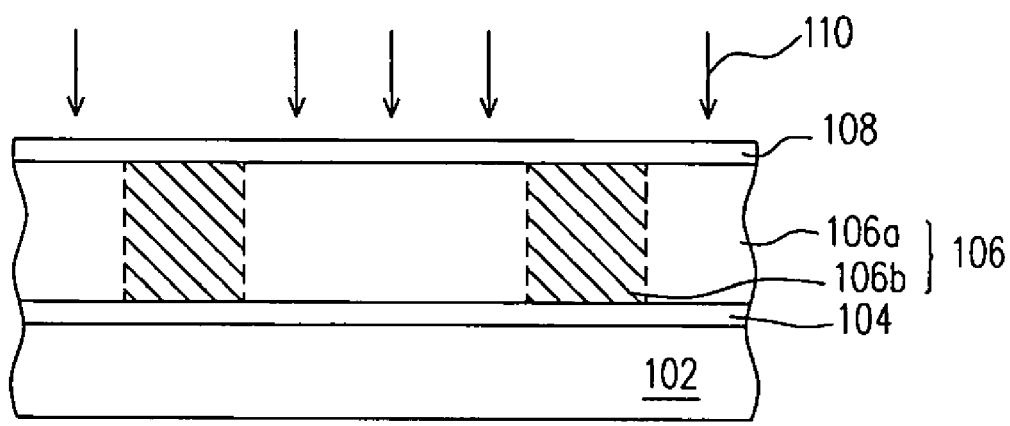

Referring to FIG. 1B, an immersion exposure step is performed within an immersion liquid to define exposed portions 106a and unexposed portions 106b, wherein the exposure light source can be any existing light source having a required wavelength. The exposure light beam 110 may irradiate on the photoresist layer 106 through a photomask (not shown) and the protective layer 108 or directly through the protective layer 108, while the latter method is called a direct-writing method. Since the immersion exposure step is conducted in a liquid that has a refractive index closer to that of the photoresist layer 106 as compared with air, the resolution of the exposure step can be improved.

It is particularly noted that the protective layer 108 is capable of preventing out-diffusion of the chemicals in the photoresist layer 106 into the immersion liquid and diffusion of the immersion liquid into the photoresist layer 106. Therefore, the immersion liquid will not be contaminated by the chemicals in the photoresist layer 106, and the properties of the photoresist layer 106 will not be altered by the immersion liquid.

Referring to FIG. 1B again, in the immersion exposure step, specific photo-chemical reactions occur in the exposed portions 106a of the photoresist layer 106 so that the exposed portions 106a are soluble in the development liquid. In a preferable embodiment, acid is produced in the exposed portions 106a of the photoresist layer 106 altering the polarity of the same in the immersion exposure step, so that the exposed portions 106a are turned to be hydrophilic from a hydrophobic state.

Figure 1C:
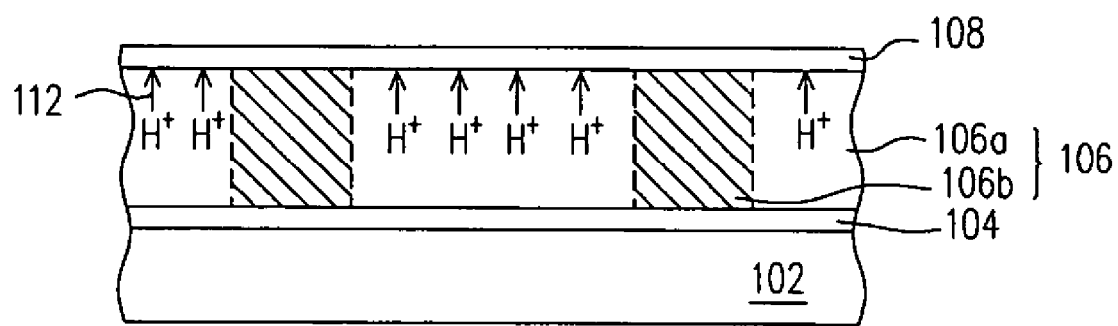

Referring to FIG. 1C, a solubilization step is performed to alter the properties of the protective layer 108 on the exposed portions 106a of the photoresist layer 106 so that the corresponding portions of the protective layer 108 are soluble in the development liquid. In a preferable embodiment, the solubilization step may include a baking step that makes the acid produced in the exposed portions 106a of the photoresist layer 106 diffuse into the overlying protective layer 108, as indicated by the arrows 112 in FIG. 1C. The properties of the corresponding portions of the protective layer 108 will be altered by the acid. For example, the corresponding portions of the protective layer 108 may turn to be hydrophilic form a hydrophobic state.

Figure 1D:
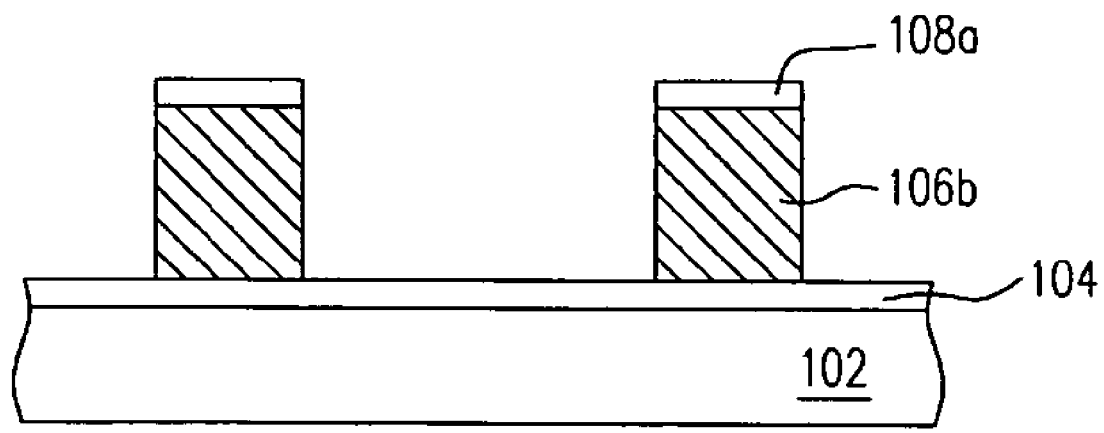

Referring to FIG. 1D, a development step is conducted to remove the exposed portions 106a of the photoresist layer 106 and the protective layer 108 thereon, leaving the unexposed portions 106b of the photoresist layer 106 and the protective layer 108a thereon. Since the exposed portions 106a of the photoresist layer 106 and the protective layer 108 thereon have been made soluble in the development liquid through the exposure step and the solubilization step, respectively, they can be removed simultaneously in the development step. Therefore, no extra step is required to remove the protective layer 108 before the development step.

Thereafter, an etching process or an ion implantation process can be conducted using the photoresist patterns 106b and the protective layer 108a as a mask.

It is particularly noted that when the photoresist patterns 106b are used as an etching mask, the thickness of the etching mask layer is increased because the photoresist patterns 106b are covered with a protective layer 108a. Therefore, the etching resistance of the etching mask layer can be enhanced.

In the above embodiment, the protective layer on the exposed portions of the photoresist layer is solubilized by the acid produced in and diffusing from the photoresist layer, so that the protective layer can be patterned simultaneously in the development step without complicating the whole patterning process. In the following embodiment, however, the corresponding portions of the protective layer are solubilized by the acid produced in and diffusing from an acid supplying layer between the photoresist layer and the protective layer. Since the acid produced in the exposed portions of the acid supplying layer also diffuses to the unexposed portions of the photoresist layer, the dimension of the photoresist pattern can be reduced accompanying with the patterning step of the protective layer. In the following descriptions, the same or similar layers or steps that have been mentioned above are labeled with the same reference numbers and are not explained again.

Second Embodiment

Figure 2A:
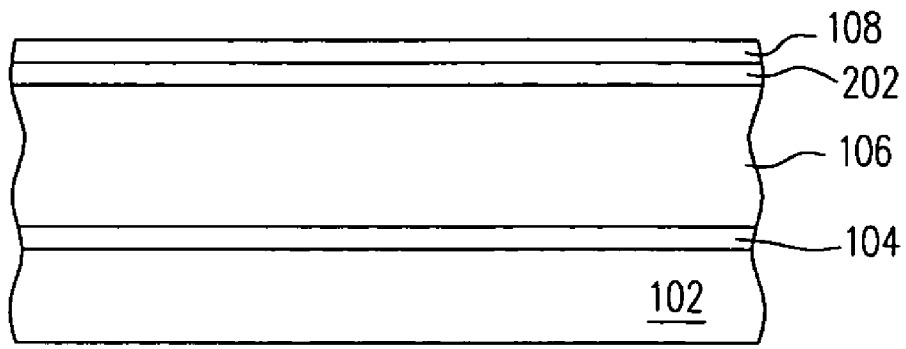
FIGS. 2A-2E illustrate the steps of an immersion lithography process according to a second embodiment of this invention in a cross-sectional view.

FIGS. 2A-2E illustrate the steps of an immersion lithography process according to the second embodiment of this invention in a cross-sectional view. Referring to FIG. 2A, a photoresist layer 106 is formed on a material layer 102 with an optional anti-reflection coating 104 between them. Thereafter, an acid supplying layer 202 and a protective layer 108 are sequentially formed on the photoresist layer 106, wherein the acid supplying layer 202 is capable of producing acid with photo-irradiation.

Figure 2B:
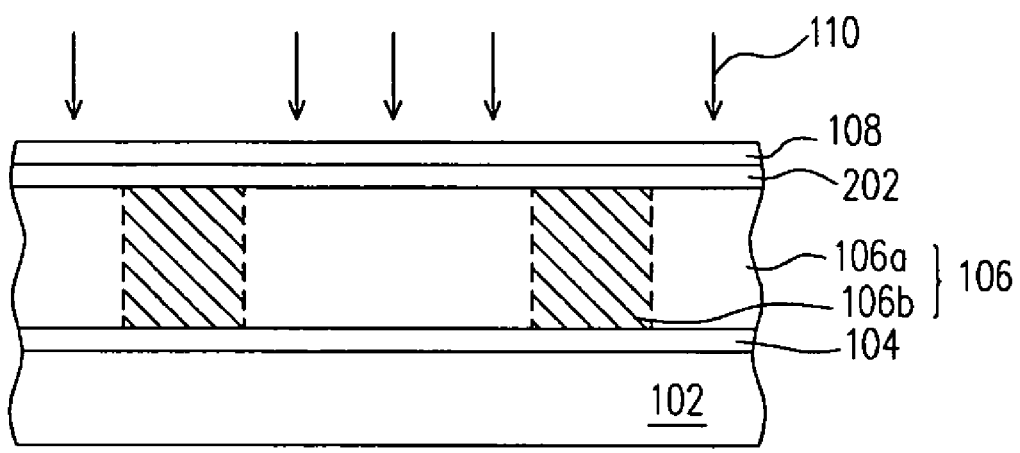

Referring to FIG. 2B, an immersion exposure step is performed to define exposed portions 106a and unexposed portions 106b in the photoresist layer 106. In the exposure step, acid is produced in the exposed portions of the photoresist layer 106 and the acid supplying layer 202, so that the exposed portions 106a of the photoresist layer 106 are made soluble in the development liquid applied later. In a preferable embodiment, the exposed portions 106a of the photoresist layer 106 is turned to be hydrophilic from a hydrophobic state.

Figure 2C:
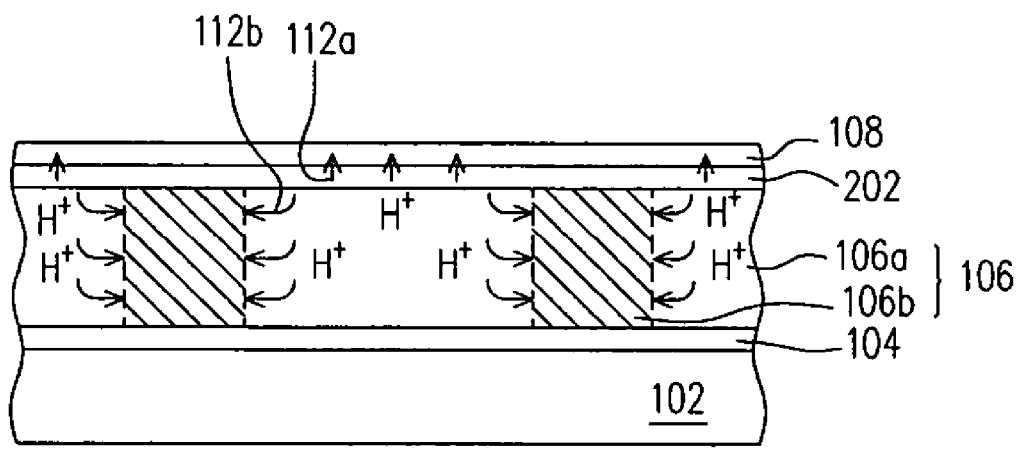
Figure 2D:
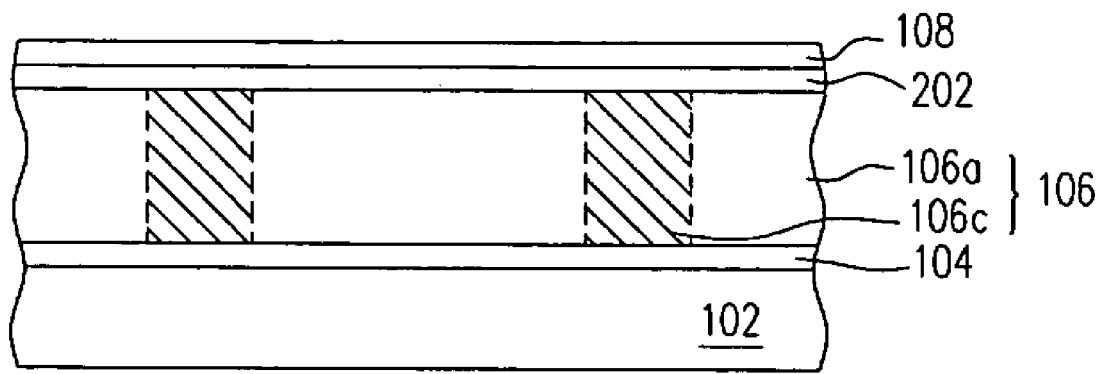

Referring to FIG. 2C, a solubilization step, which may include a baking treatment, is performed to make the acid produced in exposed portions of the acid supplying layer 202 diffuse to the overlying protective layer 108, as indicated by the arrows 112a. The acid also diffuses to the unexposed portions 106b of the photoresist layer 106, as indicated by the arrows 112b. Consequently, not only the protective layer 108 over the exposed portions 106a of the photoresist layer 106 is made soluble, but also the sidewall portions of the unexposed portions 106b of the photoresist layer 106 are made soluble in the development liquid. Therefore, the dimension of the unexposed portions 106b of the photoresist layer 106 is reduced to form narrowed unexposed portions 106c in the photoresist layer 106, as shown in FIG. 2D.

Figure 2E:
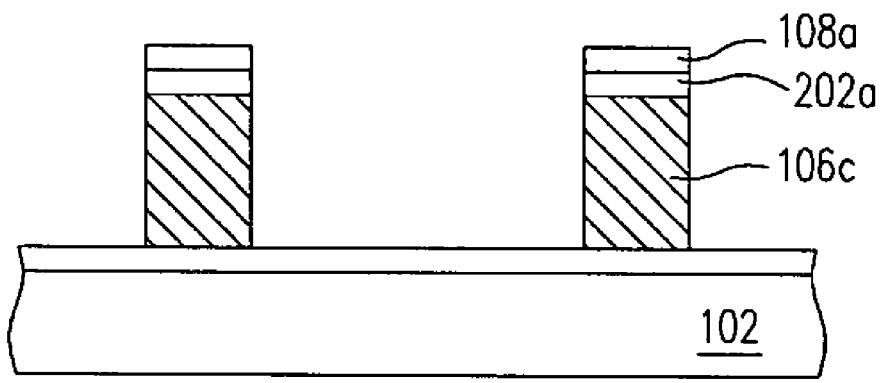

Referring to FIG. 2E, a development step is conducted to remove the exposed portions 106a of the photoresist layer 106 and the protective layer 108 and the acid supplying layer 202 thereon, leaving the narrowed unexposed portions 106c and the protective layer 108a and the acid supplying layer 202a thereon. Since the exposed portions 106a of the photoresist layer 106 and the protective layer 108 thereon have been made soluble in the development liquid through the exposure step and the solubilization step, respectively, they can be removed simultaneously in the development step. Therefore, no extra step is required to remove the protective layer 108 before the development step. Moreover, since the acid produced in the acid supplying layer 202 also diffuses to the unexposed portion 106b of the photoresist layer 106 (FIG. 2C) to solubilize its sidewall portions, the dimension of the photoresist pattern 106c can be reduced (see FIG. 2C and FIG. 2E).

Similar to the case of the first embodiment, an etching or ion implantation process can be conducted using the photoresist patterns 106c, the protective layer 108a and the acid supplying layer 202a as a mask after the above steps.

In the second embodiment, an acid supplying layer 202 is further disposed between the photoresist layer 106 and the protective layer 108 except that the protective layer 108 is formed covering the photoresist layer 106. Therefore, not only the advantages mentioned in the first embodiment are obtained, but also the dimension of the photoresist pattern can be reduced to facilitate the miniaturization of IC devices.

In both the first and the second embodiments mentioned above, the mask layer structure applied in the immersion lithography process essentially includes a photoresist layer 106 and a protective layer 108 thereon. The protective layer 108 can prevent the chemicals in the photoresist layer 106 from diffusing into the immersion liquid and prevent the immersion liquid diffusing into the photoresist layer 106, and can be patterned simultaneously in the development step of the photoresist layer. Moreover, an anti-reflection coating 104 may be formed prior to the photoresist layer 106 to improve the effects of the exposure step. In the second embodiment, the mask layer structure further include an acid supplying layer 202 between the photoresist layer 106 and the protective layer 108 for solubilizing selected portions of the protective layer 108 as well as reducing the dimension of the photoresist pattern.

As mentioned above, it is possible to prevent the chemicals in the photoresist layer from diffusing into the immersion liquid and prevent the immersion liquid from diffusing into the photoresist layer by utilizing this invention. Therefore, this invention is capable of solving the problem of mutual diffusion between the immersion liquid and the photoresist layer that is encountered in the prior art. Moreover, since the protective layer can be patterned simultaneously in the development step of the photoresist layer, no extra step is required to remove the protective layer. Therefore, the whole patterning process is not complicated.

Furthermore, with an additional acid supplying layer between the protective layer and the photoresist layer, not only the protective layer can be patterned simultaneously in the development step, but also the dimension of the photoresist pattern can be reduced. In addition, since the photoresist pattern is covered with a protective layer, the etching resistance of the mask layer is higher.

It is also noted that this invention is entirely compatible with current immersion lithography processes. In other words, the immersion lithography process of this invention can utilize the exposure light sources and the photoresist materials that are used in current immersion lithography processes.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An immersion lithography process, comprising:
   forming a photoresist layer on a material layer;
   forming a protective layer on the photoresist layer;
   performing an immersion exposure step to define at least an exposed portion and an unexposed portion in the photoresist layer;
   performing a baking step to alter a polarity of the protective layer on the exposed portion of the photoresist layer to be the same as that of the exposed portion of the photoresist layer by an acid produced in the exposed portion of the photoresist layer in the immersion exposure step; and
   performing a development step to remove the exposed portion of the photoresist layer and the protective layer on the exposed portion of the photoresist layer, wherein the exposed portion of the photoresist layer and the protective layer on the exposed portion of the photoresist layer are soluble.

2. The immersion lithography process of claim 1, wherein the acid produced in the exposed portion of the photoresist layer diffuses to the overlying protective layer to alter the polarity of the protective layer on the exposed portion of the photoresist layer in the baking step.

3. The immersion lithography process of claim 2, wherein the exposed portion of the photoresist layer and the protective layer thereon are turned to be hydrophilic from a hydrophobic state with the immersion exposure step and the baking step.

4. The immersion lithography process of claim 1, further comprising forming an anti-reflection coating on the material layer before the photoresist layer is formed.

5. An immersion lithography process, comprising:
   forming a photoresist layer on a material layer;
   forming an acid supplying layer on the photoresist layer;
   forming a protective layer on the acid supplying layer;
   performing an immersion exposure step to define an exposed portion and an unexposed portion in the photoresist layer, while an acid is produced in the exposed portion of the photoresist layer and the acid supplying layer thereon;
   performing a baking step to make the acid diffuse to the protective layer over the exposed portion of the photoresist layer and to a sidewall portion of the unexposed portion of the photoresist layer, so that the protective layer over the exposed portion of the photoresist layer has a polarity the same as that of the exposed portion of the photoresist layer; and
   performing a development step to pattern the protective layer, the acid supplying layer and the photoresist layer simultaneously by removing the exposed portion of the photoresist layer, the acid supplying layer on the exposed portion of the photoresist layer, the protective layer on the exposed portion of the photoresist layer, and the sidewall portion of the unexposed portion of the photoresist layer, wherein the exposed portion of the photoresist layer, the acid supplying layer on the exposed portion of the photoresist layer, the protective layer on the exposed portion of the photoresist layer, and the sidewall portion of the unexposed portion of the photoresist layer are soluble.

6. The immersion lithography process of claim 5, wherein the exposed portion of the photoresist layer and the protective layer thereon are turned to be hydrophilic from a hydrophobic state with the immersion exposure step and the baking step.

7. The immersion lithography process of claim 5, further comprising forming an anti-reflection coating on the material layer before the photoresist layer is formed.

* * * * *